United States Patent [19]

Scheinberg

[11] Patent Number: 4,743,862

[45] Date of Patent: May 10, 1988

[54] JFET CURRENT MIRROR AND VOLTAGE LEVEL SHIFTING APPARATUS

[75] Inventor: Norman R. Scheinberg, South River, N.J.

[73] Assignee: Anadigics, Inc., Warren, N.J.

[21] Appl. No.: 858,797

[22] Filed: May 2, 1986

[51] Int. Cl.[4] ............................................. H03F 3/16
[52] U.S. Cl. .................................. 330/277; 330/253; 330/257; 330/288; 330/311
[58] Field of Search ............... 330/253, 257, 277, 288, 330/311; 323/315, 316; 307/297

[56] References Cited

U.S. PATENT DOCUMENTS

| | | | |
|---|---|---|---|
| 3,953,807 | 4/1976 | Schade, Jr. | 330/277 |
| 4,008,441 | 2/1977 | Schade, Jr. | 330/300 X |
| 4,034,307 | 7/1977 | Schade, Jr. | 330/277 |
| 4,158,178 | 6/1979 | Schade, Jr. | 330/253 |
| 4,217,540 | 8/1980 | Shimutsuma | 368/218 X |
| 4,460,864 | 7/1984 | Ray | 323/313 |
| 4,542,348 | 9/1985 | Lucas et al. | 330/253 |
| 4,616,189 | 10/1986 | Pengue, Jr. | 330/253 |

FOREIGN PATENT DOCUMENTS

169206  9/1985  Japan ................................ 330/257

*Primary Examiner*—James B. Mullins
*Attorney, Agent, or Firm*—Richard C. Woodbridge

[57] ABSTRACT

A JFET current mirror is employed in the voltage level shifting section of an operational amplifier. The JFET current mirror includes a first and second JFET coupled at their gates for conducting current I1 and I2 respectively. The gate of a third JFET is connected to the drain of the first JFET and the source of the third JFET is connected by a plurality of diodes to the gate of the first JFET. Current flowing through the diodes produces a voltage drop across the diodes sufficient to bias the first JFET into saturation so that I2 will track I1. A fixed resistance R in the path of I2 produces a predetermined voltage level shift provided that I1 is constant. Therefore, a voltage applied to one terminal of R is level shifted by a predetermined voltage with respect to the other terminal of R. The voltage shifted output is then coupled to an internal amplifier section and the output buffer section of the operational amplifier.

12 Claims, 5 Drawing Sheets

JFET CURRENT MIRROR AND VOLTAGE LEVEL SHIFTING APPARATUS

BACKGROUND OF THE INVENTION

1. Field of the Invention

The invention relates to a JFET current mirror of the type employed in the voltage level shifting section of an operational amplifier.

2. Description of the Related Art

Figures 1, 2:
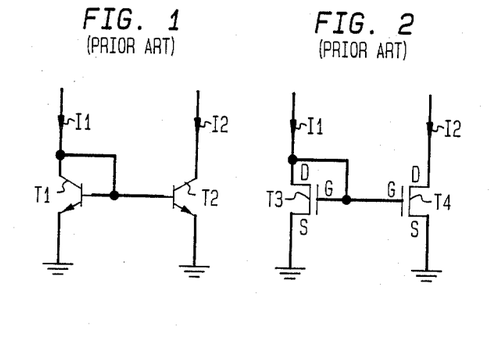
FIG. 1 represents a prior art current mirror employing conventional transistors.
FIG. 2 represents a prior art NMOS current mirror.

There are a number of current mirrors known to those of ordinary skill in the art but the use of JFETS in the context of current mirror is virtually unknown. FIG. 1 discloses a prior art current mirror using transistors. Assuming that transistor T2 is not saturated, current I2 will set itself equal to current I1 since the base emitter voltage of transistor T1 is equal to the base emitter voltage of transitor T2.

Figure 3:
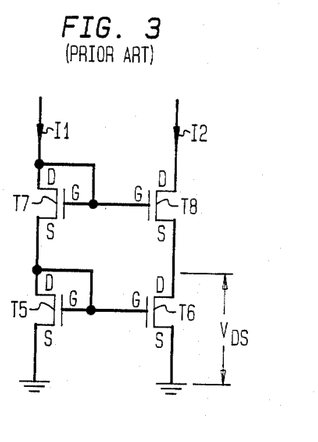
FIG. 3 represents an improved Widlar current mirror employing NMOS technology.

FIG. 2 describes another prior art current mirror employing NMOS technology. Current I2 will again set itself equal to current I1 since the gate source voltage of transistor T3 is always equal to the gate source voltage of transistor T4. Due to second order effects I2 is only approximately equal to I1. An improved circuit, known as a Widlar current mirror sets I2 closer to I1 and is shown in FIG. 3 as prior art. While the foregoing circuits operate satisfactorily for the conventional semiconductors shown, they do not work with JFETS.

Techniques are known in the context of conventional semiconductor art for biasing active devices. For example, U.S. Pat. No. 3,953,087 discloses one technique for producing a voltage drop across a semiconductor element in the context of an amplifier. However, the nature of the amplifier and the purpose for achieving the voltage drop is significantly different from that of the present invention. Another technique for biasing a semiconductor is described in U.S. Pat. No. 4,460,864 in the context of a voltage reference circuit. Lastly, U.S. Pat. Nos. 4,158,178 and 4,217,540 describe other schemes for biasing semiconductors. Insofar as understood, none of the prior art teaches or suggests useful methods for biasing a JFET in the unique context of a current mirror.

SUMMARY OF THE INVENTION

Briefly described the invention relates to a JFET current mirror of the type employed in the voltage level shifting section of an operational amplifier. The use of JFETS in the context of current mirrors is believed to be relatively uncommon. Consequently, it has been found that conventional circuit structures do not permit direct substitution of a JFET for conventional transistors or NMOS semiconductors. The JFET current mirror according to the present invention includes a first and second JFET having their gates connected together. Currents I1 and I2 flow respectively through the first and second JFET. The gate of a third JFET is connected to the drain of the first JFET and the source of the third JFET is connected by a pair of diodes to the gate of the first JFET. Current flowing through the diodes produces a voltage drop across the diodes sufficient to bias the first JFET into saturation so that I2 will track I1. A fixed resistance R1 is located in the path of current I1 and a second fixed resistance R2 is located in the path of the second current I2. Since R1 and R2 are equal and I1 and I2 are equal, therefore the voltage drop across R1 is identical to the voltage drop across R2. A fourth JFET located between R2 and the power supply acts as an input terminal for the variable voltage output of the differential amplifier section of the operational amplifier. The voltage level shifted output is taken from the junction between the drain of the second JFET and R2 and fed to an output circuit. Accordingly, variable voltages applied to the gate of the fourth JFET are level shifted a fixed amount when reproduced at the output of the circuit. According to an alternative embodiment of the invention the current mirror can be formed from two pairs of JFETS connected in cascode with their gates tied together across a pair of voltage biasing diodes. These and other features of the present invention will be more fully understood by reference to the following drawings.

DETAILED DESCRIPTION OF THE INVENTION

During the course of this invention like numbers will be used to identify like elements according to the different figures which illustrate the invention.

Figures 4A, 4B:
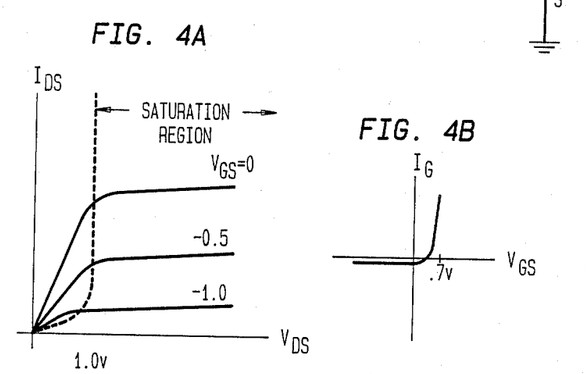
FIG. 4A is a graph of the JFET operating characteristics illustrating the relationship between the drain to source current $I_{DS}$ versus the drain to source voltage $V_{DS}$ for different values of gate to source voltage $V_{GS}$.
FIG. 4B illustrates the relationship between the gate current $I_G$ of a JFET and the voltage $V_{GS}$ between the gate and source of the same device.
Figure 4C:
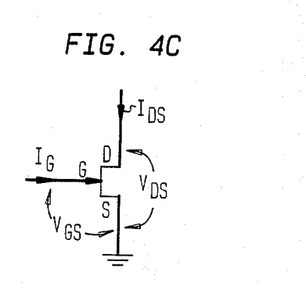
FIG. 4C illustrates the parameters $I_G$, $V_{GS}$ and $V_{DS}$ of a typical JFET.
Figure 8:
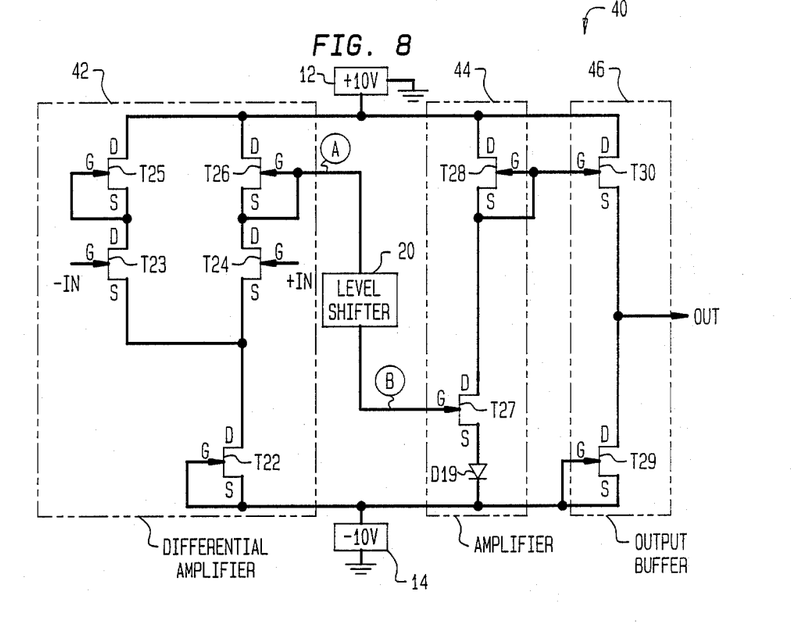
FIG. 8 illustrates a level shifter circuit such as described in FIGS. 6A, 6B or 7 in the context of an operational amplifier.

FIGS. 1 through 3 illustrate prior art approaches to constructing current mirrors employing standard transistor or NMOS technology. The prior art circuits illustrated in FIGS. 1 through 3 even if combined with known prior art biasing techniques still do not yield acceptable results when applied to JFETS. This is due in large part to the special electronic characteristics of JFETS as illustrated in FIGS. 4A–4C. A real need for a practical JFET current mirror was recognized for use in the voltage level shifting section of an operational amplifier 40 such as illustrated in FIG. 8. The purpose of the level shifter circuit 20 of FIG. 8 is to shift the voltage from the differential amplifier section 42 at point A to a lower voltage at point B suitable for driving the amplifier section 44 of the operational amplifier.

Figure 5:
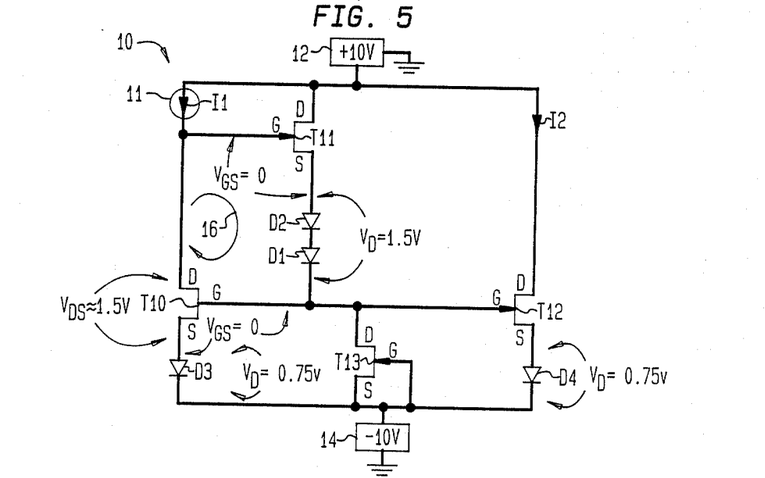
FIG. 5 illustrates the preferred embodiment of the JFET current mirror invention.
Figure 9:
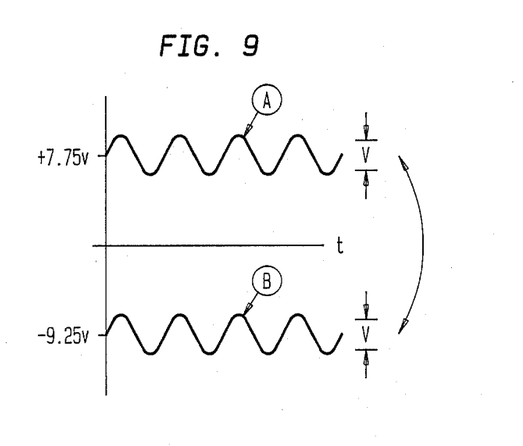
FIG. 9 illustrates the level shifted voltage produced by the circuits illustrated in FIGS. 5, 6A, 6B or 7.

FIG. 9 illustrates the ideal voltage level shifting results in which a variable voltage of approximately +7.75 volts at point A is shifted downward by 17.00 volts to an average value of −9.25 volts at terminal B. A practical solution to the problem presented by the lack of JFET current mirror technology is illustrated in FIG. 5. FIG. 5 illustrates the preferred embodiment of the basic JFET current mirror invention 10. According to FIG. 5, a first JFET T10 has its drain connected to a current source 11 for current I1 and its source connected through diode D3 to a −10 volt power supply 14. Likewise a second JFET, T12 has its drain connected to the +10 volt power supply 12 and its source connected through diode D4 to the −10 volt power supply 14. The gates of T10 and T12 are connected together. A current I1 flows through a first current path which comprises JFET T10 and diode D3. A second current I2 flows through a second current path which includes JFET T12 and diode D4. A third JFET T11 has its drain connected to the +10 volt terminal of the power supply, its gate connected to the drain of T10, and its source connected through diodes D1 and D2 to the common gate connection of JFETS T10 and T12. A fourth JFET T13 provides an active load resistance for T11 and the diodes D2 and D1. The connection of the gate and source of T13 causes the JFET to act as a high resistance current source.

In order to cause I2 to track the current I1, it is necessary to bias the first JFET T10 into saturation. Saturation can be obtained by causing the voltage $V_{DS}$ across JFET T10 to exceed approximately 1.5 volts which is shown as being the beginning of the saturation region in FIG. 4A. I1 can be chosen so that when T10 is in saturation, the voltage $V_{GS}$ is approximately 0. Since a small amount of current flows through diodes D1 and D2, it produces a voltage drop of approximately 1.5 volts which is the sum of the 0.75 volt drop across D1 and D2 in series. If T11 is chosen to have similar characteristics to T13 then $V_{GS}$ of T11 will be small and the 1.5 voltage drop across D1 and D2 will be applied across the gate and drain of JFET T10. Since $V_{GS}$ of JFET T10 is 0, the 1.5 volt drop across D1 and D2 will be applied across the source and drain of JFET T10 causing it to operate in the saturation region. Diodes D3 and D4 are chosen to have similar characteristics and therefore the 0.75 voltage drop across both is roughly identical. Accordingly, since the gates of JFETS T10 and T12 are at the same potential and since the voltage drop across D3 and D4 is the same, the current I2 conducted through JFET T12 must necessarily track the current I1 conducted through JFET 10.

Figure 6A:
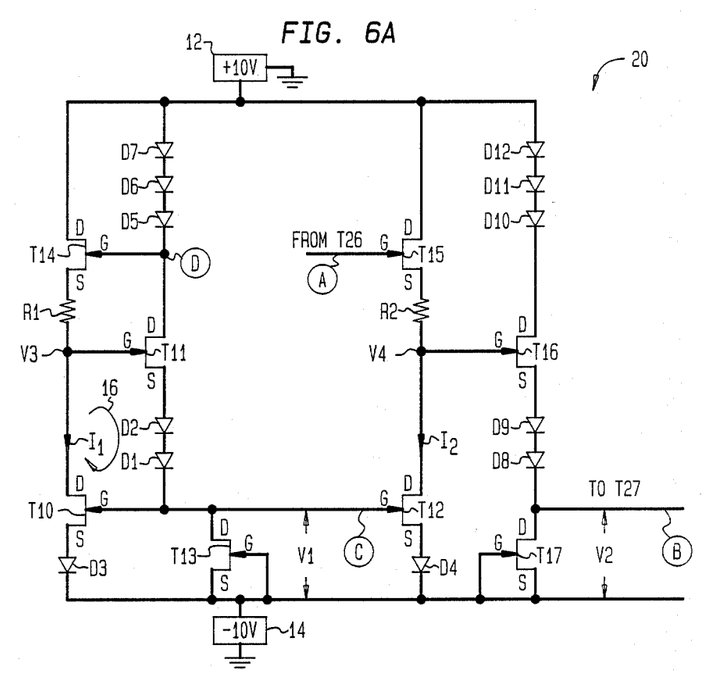
FIG. 6A illustrates an embodiment of the JFET current mirror invention in the context of a voltage level shifting apparatus.

The application of the basic JFET current mirror 10 illustrated in FIG. 5 is shown in the context of a level shifter 20 in FIG. 6A. Some additional elements have been added to the current mirror 10 shown in FIG. 5 in order to make it operate as a level shifter 20 as shown in FIG. 6A. The level shifter 20 shown in FIG. 6A is the same as the level shifter 20 illustrated in FIG. 8. A resistance R1 is located in the first current path through which current I1 flows. A second resistance R2 equal in value to R1 is located in the second current path through which current I2 flows. Provided that the voltage drop $V_D$ across diodes D1 and D2 is sufficient to place JFET T10 in saturation, current I1 will equal current I2. Since R1=R2 and I1=I2, then the voltage drop across R1 and R2 will be identical. A plurality of diodes D5, D6 and D7 are connected in series between the drain of JFET T11 and the first terminal of the +10 volt power supply 12. JFET T14 has its gate connected to the junction between the drain of JFET T11 and diodes D5, D6 and D7. The source and drain of JFET T14 are connected between load resistor R1 and the first terminal of the +10 volt power supply 12. Another JFET T15 has its source and drain connected between load resistor R2 and the first terminal of the +10 volts power supply 12. An input voltage A is applied to the gate of JFET T15. The voltage at A preferably comes from the differential amplifier section 42 of the operational amplifier 40 shown in FIG. 8 where that signal comes from the source/gate connection of JFET T26. The junction between resistor R2 and the drain of JFET T12 is connected to the gate of JFET T16. The drain of JFET T16 is connected through a series of diodes D10, D11, and D12 to the first terminal of the +10 volt power supply 12. Similarly, the source of JFET T16 is connected by diodes D9 and D8 to the drain of JFET T17. The gate and source of JFET T17 are connected to the second −10 volt power supply 14. JFET T17 acts as an active load resistance in the same manner that JFET T13 acts as an active load resistance. The output of the level shifter circuit 20 of FIG. 6A is taken across the source and drain of JFET T17 and is identified as terminal B. Terminal B corresponds to the gate connection of JFET T27 which comprises the amplifier section 44 of the operational amplifier 40 illustrated in FIG. 8. The series connection of elements D7, D6, D5, JFET T11, D2, D1 and JFET T13 are chosen to be substantially equivalent in characteristics to the following elements respectively D12, D11, D10, JFET T16, D9, D8 and JFET T17. This helps insure that the electrical characteristics of the first current path for current I1 are substantially identical to the electrical characteristics in the second current path for current I2.

Figure 6B:
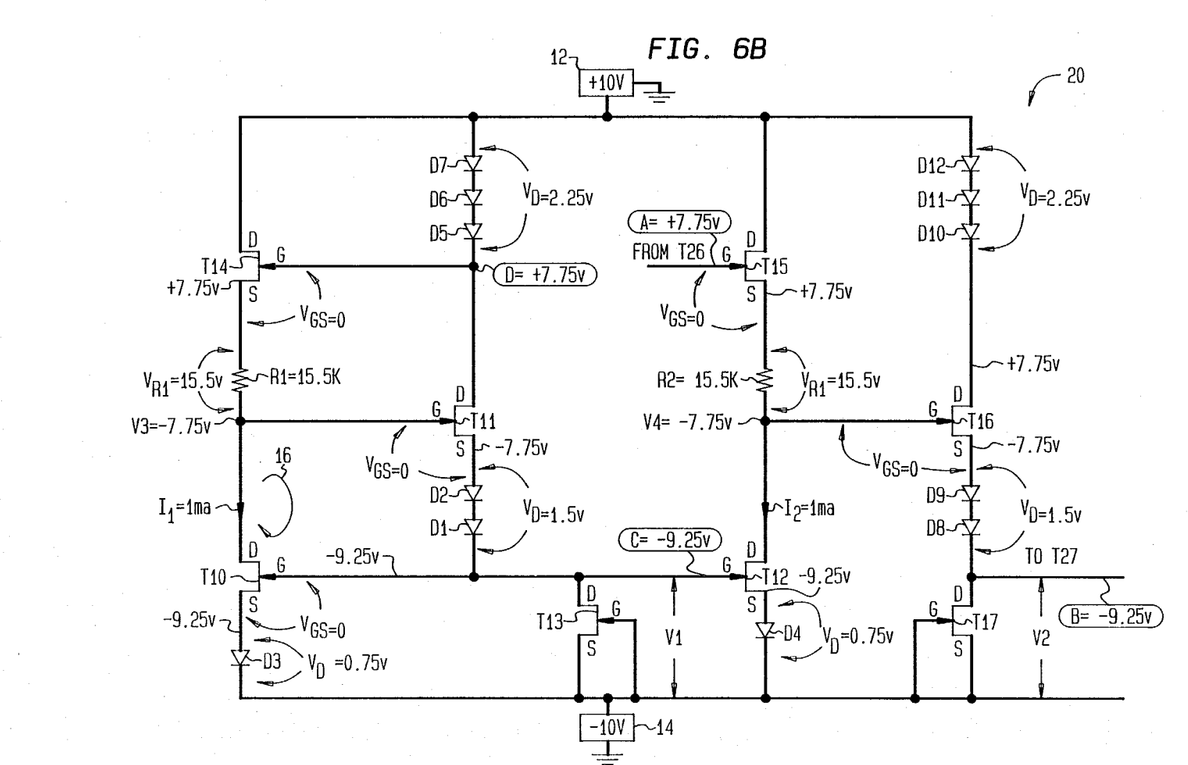
FIG. 6 illustrates the voltage levels found in the voltage level shifting apparatus of FIG. 6A.

FIG. 6B illustrates the voltage drop characteristics of the level shifting circuit 20 shown in FIG. 6A. In operation the diodes D1 and D2 cause a voltage drop $V_D$ across JFET T10 sufficient to drive it into saturation. In the saturation mode current I1 flows through the first current path and causes a voltage drop across resistor R1. When the current I1 flows through diode D3 it causes a voltage drop of approximately 0.75 volts. Since the gate to source voltage across saturated JFET T10 is approximately 0, then the voltage $V_1$, also identified as terminal C, will be 0.75 volts greater than the −10 volt power supply 14 or −9.25 volts. The voltage drop across diodes D1 and D2 is likewise 0.75 volts each thereby bringing the source of JFET T11 to −7.75 volts. Since the gate to source voltage $V_{GS}$ has been chosen to be equal to 0, then the voltage V3 at the gate of JFET T11 will likewise be −7.75 volts. With the source of JFET T10 at −9.25 volts and the drain of JFET T10 at −7.75 volts, it is clear that JFET T10 will be biased into its saturation mode. The collective voltage drop across diodes D5, D6 and D7 is approximately 2.25 volts therefore making the voltage at point D +7.75 volts. Since JFET T14 is in saturation, and T14 is chosen to have similar characteristics to T10, and both have the same drain current, then both have the same gate to source voltage which is 0. Therefore, the voltage at the source of JFET T14 +7.75 volts. Resistors R1 and R2 were both chosen to be 15.5 kilohms. Since one terminal of R1 is at +7.75 volts and the other terminal of R1 is at −7.75 volts, the current flowing through R1 must be 1 milliampere. Unless the −10 volt power supply voltage changes or the voltage D changes, the current I1 in the first current path will always remain at 1 milliampere. JFET T13 can be considered either as a current source or as a high active resistance.

The current I in the second current path necessarily mirrors and mimics the current I1 in the first current path. The 0.75 voltage drop across D4 places the source of JFET T12 at a −9.25 volts. The gate of JFET T12 is at the same identical voltage −9.25 volts as the gate of JFET T10. Because the gates and sources of JFETS T10 and T12 are at identical voltages, they must by definition draw identical currents. Therefore, if JFET T10 draws 1 milliampere, JFET T12 must draw 1 milliampere too. If the voltage at A is set to +7.5 volts (the same as D), and if T15 has the same characteristics as T12, then $V_{GS}$ of T15 will equal 0 and the upper terminals of R2 will be +7.5 volts. $V_{GS}$ of T15 equals 0 because T15 has the same drain current, I2, as T12, and $V_{GS}$ of T12 equals 0. Since R2=15.5 kilohms and 1 milliampere flows through R2, the lower terminal of R2 will be at −7.5 volts.

It is clear at this stage that the current I1 flowing in the first current path will never be affected by the value of the current I2 flowing in the second current path, but the current I2 flowing in the second current path will be affected by the current I1 flowing in the first current path. Therefore, assuming that the current I1 in the first current path is always equal to 1 milliamp, the voltage drop across resistor R2 will always be 15.5 volts. Any voltage applied to the gate of JFET T15 at terminal A will always be level shifted by a fixed amount by resistor R2 at voltage point V4.

The drain of JFET T12 is connected to the gate of JFET T16. The drain of JFET T16 is connected by diodes D10, D11 and D12 to the plus terminal of the 10 volt power supply 12. Similarly the source of JFET T16 is connected by diodes D8 and D9 to the drain of JFET T17. The source and gate of JFET T17 are connected together to form an ideal current source having a high active resistance. The voltage V2 measured at terminal B is taken across the drain and source of JFET T17. It will be noted again that the connection of JFET T13, diodes D1 and D2, JFET T11, and diodes D5, D6 and D7 is directly analogous to the connections of JFET T17, diodes DB and D9, JFET T16 and diodes D10, D11 and D12. Moreover those elements were chosen so that they would have the same electrical characteristics. That is to say that JFET T13 has the same characteristics of JFET T17, JFET T11 has the same electrical characteristics as JFET T16, and diodes D1, D2, D5, D6 and D7 have the same respective characteristics as diodes D8, D9, D10, D11 and D12.

Under the conditions just described if the gate to source voltage at JFET T16 is 0, then the source of JFET T16 will be −7.75 volts if the voltage at terminal A is +7.75 volts. Since the voltage drop across diodes D8 and D9 is 0.75 volts respectively, the output voltage V2 at terminal B will be −9.25 volts.

If the voltage at A should drop from +7.75 volts to 7.65 volts then the voltage V4 will drop from −7.75 volts to −7.85 volts and the voltage V2 at terminal B will drop from −9.25 volts to −9.35 volts. Conversely, if the voltage at terminal A rises from +7.75 volts to +7.85 volts, the voltage V4 will rise from −7.75 volts to −7.65 volts and the voltage V2 at terminal B will rise to −9.15 volts. In summary, the voltage at terminal A will always be shifted downwards by 17 volts at terminal B.

The level shifter 20 shown in FIG. 6 is the same as the level shifter 20 shown in FIG. 8. Terminal A which comprises the gate of JFET T15 is connected to the output of the differential amplifier section 42 taken across the gate and source of JFET T26. The voltage at terminal A is then level shifted by level shifter 20 to a value at terminal B which forms the input to the gate of JFET T27 which comprises part of the amplifier section 44 of the operational amplifier 40. Amplifier Section 44 is connected to the output of operational amplifier 40 by output buffer section 46. All of the transistors shown in FIGS. 5 through 8 are GaAs MESFETS which are a class of JFETS. FIG. 9 illustrates how the voltage at terminal A, which has an average value of +7.75 volts is tracked by the voltage at terminal B which has an average value of −9.25 volts.

The basic building block of the level shifter 20 of FIG. 8 is the current mirror circuit 10 illustrated in FIG. 5. The current mirror basic subcircuit 10 illustrated in FIG. 5 includes a feedback loop 16 that tends to drive the current I1 in the first current path back to a steady state value of 1 milliamp. The feedback path 16 is formed by the drain of JFET T10 through the gate and source of JFET T11 and diodes D1 and D2 to the gate of JFET T10. With reference to FIG. 6A, if the current I1 decreases the voltage at the drain of JFET T10 will increase. Since the voltage at the drain of JFET T10 is substantially equal to the voltage at the source of JFET T11 which will be dropped by 1.5 volts and applied to the gate of JFET T10, this has the effect of increasing the voltage between the gate and source of JFET T10, thereby causing an increase in the flow of current I1. Conversely, an increase of current I1 above its normal state will cause a decrease of potential between the gate and source of JFET T10, thereby tending to drive the current I1 back to its normal 1 milliamp state.

Figure 7:
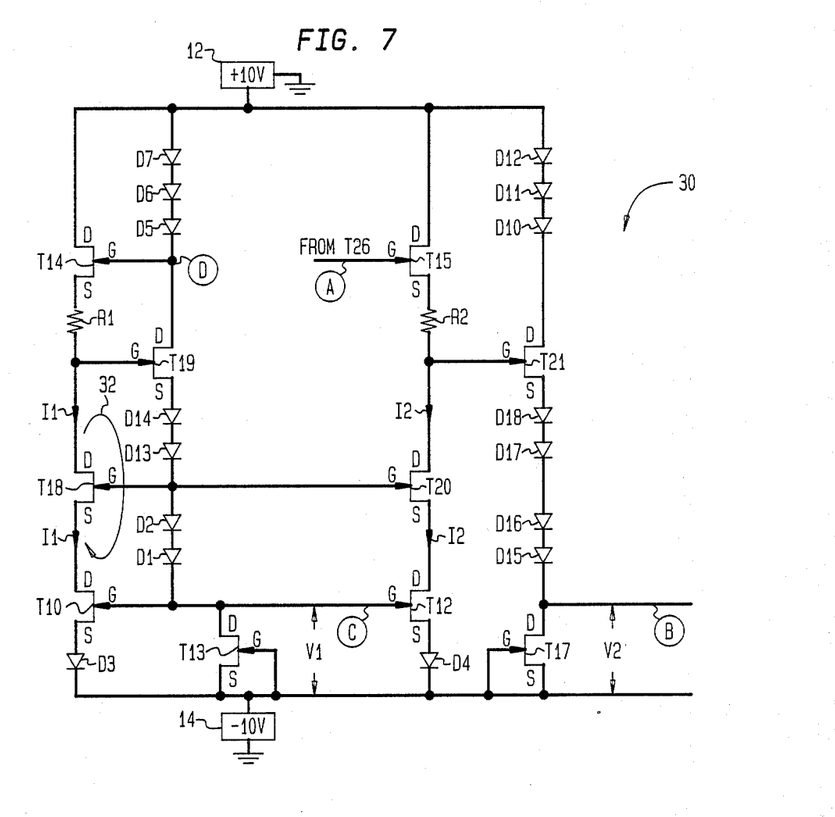
FIG. 7 illustrates an alternative embodiment of the JFET current mirror invention in the context of an improved level shifter where JFETS are connected in cascode.

FIG. 7 illustrates an alternative embodiment of a level shifter 30 employing the basic concept. According to that embodiment additional JFETS J18 and J20 are added in cascode with JFETS T10 and T12 respectively. JFETS J18 and J20 guarantee that T10 and T12 have the same drain to source voltage even if the voltage at A changes. The effect of this is to make the cascode circuit 30 look like better current sources than JFETS T10 and T12 alone. JFET T19 is roughly equivalent in function to JFET T11 illustrated in FIGS. 6A and 6B. A feedback loop 32 analogous to feedback loop 16 illustrated in FIGS. 5, 6A, 6B tends to keep current I1 stable. The current mirror structure 30 illustrated in FIG. 7 should be considered as an improvement over the basic current mirror 10 illustrated in FIG. 5 and as employed in a level shifter 20 such as illustrated in FIGS. 6A and 6B.

Level shifters 20 and 30 as illustrated in FIGS. 6A, 6B and 7 can be employed in a standard operational amplifier circuit 40 such as shown in FIG. 8. The standard operational amplifier 40 includes a differential amplifier section 42, level shifter section 20, amplifier section 44 and output buffer section 46 as previously described. Either level shifter 20 or 30 could be substituted for the level shifter section of the operational amplifier 40. The level shifting function is illustrated in FIG. 9 wherein the average +7.75 volts at terminal A is level shifted downward by 17.0 volts to a −9.25 volt average level. The AC voltage at terminal A is passed through level shifter 20 undistorted, but level shifted downward by 17.0 volts.

While the invention has been described with reference to the preferred embodiment thereof, it will be appreciated by those of ordinary skill in the art that various changes can be made to the parts and structure of the invention without departing from the spirit and scope thereof.

I claim:

1. A voltage level shifter apparatus including a current mirror connected across a power supply having a first and a second terminal and further including a plurality of JFETs each including a gate, source and drain, said voltage level shifter apparatus comprising:

first current path means for conducting a current I1, said first current path means including a first JFET;

second current path means for conducting a current I2, said second current path means including a second JFET whose gate is connected to the gate of said first JFET;

biasing means for biasing said first JFET into saturation and including a third JFET and a diode means comprising a first and second diode means connected in series and wherein the drain of said first JFET is connected to the gate of said third JFET and the source of said third JFET is connected through said first and second diode means to the gate of said first JFET;

third diode means connected between the source of said first JFET and said second terminal of said power supply;

fourth diode means connected between the source of said second JFET and said second terminal of said power supply;

first resistor means connected in said first current path means between the drain of said first JFET and said first terminal of said power supply;

second resistor means connected in said second current path means between the drain of said second JFET and said first terminal of said power supply;

variable voltage input means connected between said second resistor means and said first terminal of said power supply; and, output circuit terminal means connected to the junction between the drain of said second JFET and said second resistor means, wherein when said first JFET is biased into saturation said second current I2 will be substantially equal to said first current I1 and wherein a variable voltage applied to said variable voltage input means is level shifted by the voltage drop across said second resistor means.

2. The apparatus of claim 1 wherein said variable voltage input means comprises a fourth JFET.

3. The apparatus of claim 2 further comprising:

fifth JFET means having a source connected to said first resistor means and a drain connected to said first terminal of said power supply and a gate connected to the drain of said third JFET; and, fifth diode means connected between said first terminal of said power supply and said gate of said fifth JFET.

4. The apparatus of claim 3 wherein said output voltage terminal means includes:

a sixth JFET having its gate connected to the junction between the drain of said second JFET and said second resistor means;

sixth diode means connected between the drain of said sixth JFET and said first terminal of the power supply; and, seventh diode means connected between the source of said sixth JFET and said second terminal of said power supply.

5. The apparatus of claim 4 further comprising:

seventh JFET having its drain connected to the gate of said first JFET and its source and gate connected to the second terminal of said power supply; and, eighth JFET having its drain connected to said seventh diode means and its gate and source connected to said second terminal of said power supply, wherein the voltage level output of said apparatus is obtained at the junction of the drain of said eighth JFET and said seventh diode means.

6. A voltage level shifer apparatus including a current mirror connected across a power supply having a first and second terminal and a plurality of JFETs each including a gate, source and drain, said voltage level shifter apparatus comprising:

first current path means for conducting a current I1, said first current path means including a first JFET;

second current path means for conducting a current I2, said second current path means including a second JFET having its gate connected to the gate of said first JFET;

biasing means for biasing said first JFET into saturation and including a third JFET connected in cascode with said first JFET such that the drain of said first JFET is connected to the source of said third JFET and the drain of said third JFET is connected to the first terminal of said power supply, said biasing means further including first and second diode means connected between the gate of said third JFET and the gate of said first JFET;

a first JFET having its source connected in cascode to the drain of said second JFET, said drain of said fourth JFET being connected to said first terminal of said power supply and said gate of said fourth JFET being connected to the gate of said third JFET;

a fifth JFET having its gate connected to the drain of said third JFET, said drain of said fifth JFET being connected to said first terminal of said power supply;

third diode means connected between the source of said fifth JFET and the gate of said third JFET;

fourth diode means connected between the source of said first JFET and said second terminal of said power supply;

fifth diode means connected between the source of said second JFET and the second terminal of said power supply;

a sixth JFET having its drain connected to the gate of said first JFET and its gate and source connected together to said second terminal of said power supply;

a seventh JFET having its gate connected to the drain of said fourth JFET;

sixth diode means having one end thereof connected to the source of said seventh JFET; and, an eighth JFET having its drain connected to the other end of said sixth diode means and having its gate and source connected together to said second terminal of said power supply, wherein when said first JFET is biased into saturation said second current I2 will be substantially equal to said first current I1 and the output of said apparatus is taken across the drain and source of said eighth JFET.

7. A voltage level shifer apparatus including a current mirror connected across the power supply having a first and second terminal and a plurality of JFETs each including a gate, source and drain, said voltage level shifter apparatus comprising:
first current path means for conducting a current I1, said first current path means including a first JFET whose source is connected to said second terminal;
second current path means for conducting a current I2, said second current path means including a second JFET whose gate is connected to the gate of said first JFET and whose source is also connected to said second terminal;
biasing means for biasing said first JFET into saturation, said biasing means including a third JFET and a first diode means, wherein the drain of said first JFET is connected to the gate of said third JFET and the source of said third JFET is connected by said first diode means to the gate of said first JFET;
first resistor means connected in said first current path means between the drain of said first JFET and said first terminal of the power supply;
second resistor means connected in said second current path means between the drain of said second JFET and said first terminal of said power supply;
variable voltage input means connected between said second resistor means and said first terminal of said power supply;
output circuit terminal means connected to the junction between the drain of said second JFET and said second resistor means,
wherein when said first JFET is biased into saturation said second current I2 will be substantially equal to said first current I1 and wherein a variable voltage applied to said variable voltage input means is level shifted by the voltage drop across the second resistor means.

8. The apparatus of claim 7 further comprising:
second diode means connected between the source of said first JFET and said second terminal of said power supply; and,
third diode means connected between the source of said second JFET and said second terminal of said power supply.

9. The apparatus of claim 8 wherein said first diode means comprises at least two diodes connected in series.

10. A voltage level shifter apparatus including a current mirror connected across a power supply having a first and second terminal and a plurality of JFETs each including a gate, source and drain, said voltage level shifter apparatus comprising:
first current path means for conducting a current I1, said first current path means including a first JFET source is connected to said second terminal;
second current path means for conducting a current I2, said second current path means including a second JFET whose gate is connected to the gate of said first JFET and whose source is also connected to said second terminal;
biasing means for biasing said first JFET into saturation, said biasing means including a third JFET and a first diode means, wherein the drain of said first JFET is connected to the gate of said third JFET and the source of said third JFET is connected by said first diode menas to the gate of said first JFET;
first resistor means connected in said first current path means between the drain of said first JFET and said first terminal of the power supply;
second resistor means connected in said second current path means between the drain of said second JFET and said first terminal of said power supply;
variable voltage input means connected between said second resistor means and said first terminal of said power supply;
output circuit terminal means connected to the junction between the drain of said second JFET and said second resistor means,
wherein when said JFET is biased into saturation said second current I1 will be substantially equal to said first current I1.

11. A voltage level shifer apparatus including a current mirror connected across a power supply having a first and second terminal and a plurallity of JFETs each having a gate, source and drain, said voltage level shifter apparatus comprising:
first current path means for conducting a current I1, said first current path means including a first JFET;
second current path means for conducting a current I2, said second current path means including a second JFET having its gate connected to the gate of said first JFET;
a third JFET connected in cascode with said first JFET such that the drain of said first JFET is connected to the source of said third JFET and the drain of said third JFET is connected to the first terminal of said power supply;
at least a first and second diode means connected between the gate of said third JFET and the gate of said first JFET;
a fourth JFET having its source connected in cascode to the drain of said second JFET, said drain of said fourth JFET being connected to said first terminal of said power supply and said gate of said fourth JFET being connected to the gate of said third JFET,
a fifth JFET having its gate connected to the drain of said third JFET, said drain of said fifth JFET being connected to the first terminal of said power supply;
third diode means connected between the source of said fifth JFET and the gate of said third JFET;
fourth diode means connected between the source of said first JFET and said second terminal of said power supply;
fifth diode means connected between the source of said second JFET and a second terminal of said power supply;
sixth JFET having its drain connected to the gate of said first JFET and its gate and source connected together to said second terminal of said power supply;
seventh JFET having its gate connected to the drain of said fourth JFET;
sixth diode means having one end thereof connected to the source of said seventh JFET; and,
an eighth JFET having its drain connected to the other end of said sixth diode means and having its gate and source connected together to said second terminal of said power supply, wherein the output of said apparatus is taken across the drain and source of said eighth JFET and when said first JFET is biased into saturation said second current I2 will be substantially equal to said first current I1.

12. The apparatus of claim 6 further comprising:
first resistor means connected between the drain of said third JFET and said first terminal of said power supply;
second resistor means substantially equal in resistance to said first resistor means having one end connected to the drain of said fourth JFET; and,
ninth JFET having its source connected to the other end of said second resistor means and having its drain connected to said first terminal of said power supply.

* * * * *